United States Patent
Shen et al.

(10) Patent No.: US 12,483,195 B2
(45) Date of Patent: Nov. 25, 2025

(54) BASEBAND FREQUENCY SELECTIVE AND SYMBOL BASED POWER ADAPTIVE MAGNITUDE AND PHASE ADJUSTMENT FOR WIDEBAND DOHERTY POWER AMPLIFIERS

(71) Applicant: Telefonaktiebolaget LM Ericsson (publ), Stockholm (SE)

(72) Inventors: Yiming Shen, Ottawa (CA); Robert Salmond, Nepean (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 437 days.

(21) Appl. No.: 18/043,363

(22) PCT Filed: Sep. 21, 2020

(86) PCT No.: PCT/IB2020/058781
§ 371 (c)(1),
(2) Date: Feb. 28, 2023

(87) PCT Pub. No.: WO2022/058778
PCT Pub. Date: Mar. 24, 2022

(65) Prior Publication Data
US 2023/0318534 A1    Oct. 5, 2023

(51) Int. Cl.
*H03F 1/02* (2006.01)
*H03F 3/21* (2006.01)

(52) U.S. Cl.
CPC ......... *H03F 1/0288* (2013.01); *H03F 1/0233* (2013.01); *H03F 3/211* (2013.01); *H03F 2200/102* (2013.01); *H03F 2200/451* (2013.01)

(58) Field of Classification Search
CPC ...... H03F 1/0288; H03F 1/0233; H03F 3/211; H03F 2200/102; H03F 2200/451
(Continued)

(56) References Cited

U.S. PATENT DOCUMENTS 5,886,573 A    3/1999  Kolanek
6,147,553 A *  11/2000 Kolanek ................. H03F 3/211
                                                         330/10
(Continued)

FOREIGN PATENT DOCUMENTS

EP    2 858 236 A1    4/2015
WO    2019/186229 A1  10/2019

OTHER PUBLICATIONS

Darraji et. al. ("A Dual-Input Digitally Driven Doherty Amplifier Architecture for Performance Enhancement of Doherty Transmitters", IEEE Transactions on Microwave Theory and Techniques, vol. 59, No. 5, May 2011, pp. 1284-1293) (Year: 2011).*
(Continued)

*Primary Examiner* — Hafizur Rahman
(74) *Attorney, Agent, or Firm* — Weisberg I.P. Law, P.A.

(57) ABSTRACT

A Doherty power amplifier and a method therefor are disclosed. According to one aspect, a Doherty power amplifier includes an input having a first signal path and a second signal path. The first signal path receives a first input signal at a first frequency (f1), splits the first input signal into a first main path signal and a first peak path signal according to a first splitter ratio determined in response to a first envelope of the first input signal. The second signal path receives a second input signal at a second frequency (f2), and splits the second input signal into a second main path signal and a second peak path signal according to a second splitter ratio determined in response to a second envelope of the second input signal.

22 Claims, 5 Drawing Sheets

(58) Field of Classification Search
USPC .............................................. 330/124 R, 295
See application file for complete search history.

(56) References Cited

U.S. PATENT DOCUMENTS

| | | |
|---|---|---|
| 8,837,629 B2 | 9/2014 | Ghannouchi et al. |
| 9,118,279 B2 | 8/2015 | Staudinger et al. |
| 9,203,348 B2 | 12/2015 | Ahmed et al. |
| 9,419,566 B2 | 8/2016 | Noori et al. |
| 9,490,755 B2 | 11/2016 | Ahmed et al. |
| 9,647,611 B1 | 5/2017 | Embar et al. |
| 9,667,199 B1 | 5/2017 | McLaren |
| 9,748,903 B2 | 8/2017 | Staudinger et al. |
| 2009/0096521 A1 | 4/2009 | Liu et al. |
| 2014/0320214 A1* | 10/2014 | Liu .......................... H03F 1/56 330/295 |
| 2017/0077874 A1 | 3/2017 | Ahmed et al. |
| 2017/0111014 A1 | 4/2017 | Staudinger et al. |

OTHER PUBLICATIONS

International Search Report and Written Opinion dated Jun. 14, 2021 issued in PCT Application No. PCT/IB2020/058781 filed Sep. 21, 2020, consisting of 14 pages.

\* cited by examiner

BASEBAND FREQUENCY SELECTIVE AND SYMBOL BASED POWER ADAPTIVE MAGNITUDE AND PHASE ADJUSTMENT FOR WIDEBAND DOHERTY POWER AMPLIFIERS

CROSS-REFERENCE TO RELATED APPLICATION

This application is a Submission Under 35 U.S.C. § 371 for U.S. National Stage Patent Application of International Application Number: PCT/IB2020/058781, filed Sep. 21, 2020 entitled "BASEBAND FREQUENCY SELECTIVE AND SYMBOL BASED POWER ADAPTIVE MAGNITUDE AND PHASE ADJUSTMENT FOR WIDEBAND DOHERTY POWER AMPLIFIERS," the entirety of which is incorporated herein by reference.

TECHNICAL FIELD

This disclosure relates to wireless communication and in particular, to Doherty power amplifiers in radio frequency transmitters and to baseband frequency selective and symbol based power adaptive magnitude and phase adjustment for wideband Doherty power amplifiers.

BACKGROUND

The Third Generation Partnership Project (3GPP) has developed and is developing standards for Fourth Generation (4G) (also referred to as Long Term Evolution (LTE)) and Fifth Generation (5G) (also referred to as New Radio (NR)) wireless communication systems. Such systems provide, among other features, wideband communication between network nodes, such as base stations, and mobile wireless devices (WD), as well as communication between network nodes and between WDs.

With increased bandwidth of operation, wideband Doherty power amplifiers are contemplated for use in radio frequency (RF) transmitters to provide high efficiency for low amplitude signals and linear operation for high power signals over a broad range of carrier frequencies. For example, a bandwidth of a New Radio multicarrier signal can be as wide as a few hundred mega-Hertz (MHz). For such bandwidths, the signal power level statistics at different carrier frequencies can vary considerably.

Further, for wideband Doherty power amplifiers, an optimum magnitude and phase difference between a main branch of the Doherty power amplifier and a peak branch of the Doherty power amplifier may be considerably different at different frequencies.

SUMMARY

Some embodiments advantageously provide a method and system for baseband frequency selective and symbol based power adaptive magnitude and phase adjustment for wideband Doherty power amplifiers.

In some embodiments, a magnitude and phase difference between main and peak branches of the Doherty power amplifier are assigned according to frequency and according to signal statistics which are different at different frequencies. For example, when the signal power is low, more power may be allocated to the main amplifier of the Doherty power amplifier to achieve high efficiency, and when the power of the signal is high, more power may be allocated to the peak amplifier of the Doherty power amplifier to achieve linearity. More particularly, not only are the magnitude and phase difference between main and peak branches assigned for each of a plurality of frequencies, at each such frequency, the magnitude and phase difference between main and peak branches for the frequency are adapted according to signal statistics of the signal at the frequency. This adaptive adjustment to magnitude and phase may be done based on variations in signal power from symbol to symbol.

According to one aspect, a Doherty power amplifier is provided. The Doherty power amplifier includes an input configured to receive a plurality of input signals, each input signal being associated with a different one of a plurality of carrier frequencies. The DPA includes, for each of a plurality of the input signals received by the Doherty power amplifier: an envelope detector configured to detect an envelope of the input signal; a first look up table configured to determine a dynamic power splitter setting in response to the detected envelope; a dynamic power splitter configured to split the input signal into a main path signal in a main path and a peak path signal in a peak path according to the dynamic power splitter setting; a main path phase adjuster configured to adjust a phase of the main path signal according to a main path phase adjustment that is based at least in part on the detected envelope; and a peak path phase adjuster configured to adjust a phase of the peak path signal according to a peak path phase adjustment that is based at least in part on the detected envelope. The DPA also includes a first upconverter to upconvert a sum of the main path signals to provide a main amplifier input signal; a second upconverter to upconvert a sum of the peak path signals to provide a peak amplifier input signal; a main amplifier configured to receive and amplify the main amplifier input signal; and a peak amplifier configured to receive and amplify the peak amplifier input signal.

According to this aspect, in some embodiments, at least one of the main path phase adjuster and the peak path phase adjuster for each input signal of the plurality of input signals is configured to produce a phase difference between the main path signal and the peak path signal, the phase difference being based at least in part on a power of the detected envelope of the input signal. In some embodiments, the dynamic power splitter setting, in response to the detected envelope of an input signal of the plurality of the input signals, establishes an allocation of power between the main path signal and the peak path signal based at least in part on a power of the detected envelope of the input signal. In some embodiments, the first look up table is configured to provide a mapping between a power of the detected envelope of the input signal and the dynamic power splitter setting, the mapping being based at least in part on statistics of the input signal. In some embodiments, the DPA includes a main path look up table for each input signal of the plurality of input signals, the main path look up table configured to provide a main path phase adjustment in response to the detected envelope of the input signal, the main path phase adjustment being utilized by the main path phase adjuster to adjust the phase of the main path signal. In some embodiments, the main path phase adjustment is based at least in part on statistics of the input signal. In some embodiments, the DPA includes a peak path look up table for each input signal of the plurality of input signals, the peak path look up table providing a peak path phase adjustment in response to the detected envelope of the input signal, the peak path phase adjustment being utilized by the peak path phase adjuster to adjust the phase of the peak path signal. In some embodiments, the peak path phase adjustment is based at least in part on statistics of the input signal. In some embodiments, at least one of the envelope detector, first look up table, dynamic power splitter, main path phase adjuster and peak path phase adjuster are comprised in application specific integrated circuitry in a signal path of the Doherty power amplifier that is prior to the first and second upconverters, the first and second upconverters comprised in a radio frequency integrated circuit. In some embodiments, at least one of the envelope detector, first look up table, dynamic power splitter, main path phase adjuster and peak path phase adjuster are comprised in a same radio frequency integrated circuit that comprises the first and second upconverters.

According to another aspect, a method in a Doherty power amplifier is provided. The method may be implemented by processing circuitry, and includes for each of a plurality of input signals received by the Doherty power amplifier, each input signal being associated with a different one of a plurality of carrier frequencies: detecting an envelope of the input signal; determining a dynamic power splitter setting in response to the detected envelope; splitting the input signal into a main path signal in a main path and a peak path signal in a peak path according to the dynamic power splitter setting; adjusting a phase of the main path signal according to a main path phase adjustment that is based at least in part on the detected envelope; and adjusting a phase of the peak path signal according to a peak path phase adjustment that is based at least in part on the detected envelope. The method further includes upconverting a sum of the main path signals to provide a main amplifier input signal; upconverting a sum of the peak path signals to provide a peak amplifier input signal; amplifying the main amplifier input signal; and amplifying the peak amplifier input signal.

According to this aspect, in some embodiments, at least one of adjusting the phase of the main path signal and adjusting the phase of the peak path signal is configured to produce a phase difference between the main path signal and the peak path signal, the phase difference being based at least in part on a power of the detected envelope of the input signal. In some embodiments, the determined dynamic power splitter setting, in response to the detected envelope of an input signal of the plurality of the input signals, establishes an allocation of power between the main path signal and the peak path signal based at least in part on a power of the detected envelope of the input signal. In some embodiments, the dynamic power splitter setting is selected from a first look up table configured to provide a mapping between a power of the detected envelope of the input signal and the dynamic power splitter setting, the mapping being based at least in part on statistics of the input signal. In some embodiments, the main path phase adjustment is obtained from a main path look up table in response to the detected envelope of the input signal. In some embodiments, the main path phase adjustment is based at least in part on statistics of the input signal. In some embodiments, the peak path phase adjustment is obtained from a peak path look up table in response to the detected envelope of the input signal. In some embodiments, the peak path phase adjustment is based at least in part on statistics of the input signal.

According to yet another aspect, a Doherty power amplifier is provided. The DPA includes an input having a first signal path and a second signal path. The first signal path is configured to receive a first input signal at a first frequency, the first signal path having first circuitry configured to split the first input signal into a first main path signal and a first peak path signal according to a first splitter ratio determined in response to a first envelope of the first input signal. The second signal path is configured to receive a second input signal at a second frequency, the second signal path having second circuitry configured to split the second input signal into a second main path signal and a second peak path signal according to a second splitter ratio determined in response to a second envelope of the second input signal.

According to this aspect, in some embodiments, the first splitter ratio is obtained from a first look up table responsive to the first envelope and the second splitter ratio is obtained from a second lookup table responsive to the second envelope. In some embodiments, the first splitter ratio and the second splitter ratio are based at least in part on statistics of the first input signal and the second input signal, respectively. In some embodiments, the first circuitry is further configured to adjust a phase of the first main path signal in response to the first envelope of the first input signal and to adjust a phase of the first peak path signal in response to the first envelope of the first input signal; and the second circuitry is further configured to adjust a phase of the second main path signal in response to the second envelope of the second input signal and to adjust a phase of the second peak path signal in response to the second envelope of the second input signal.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
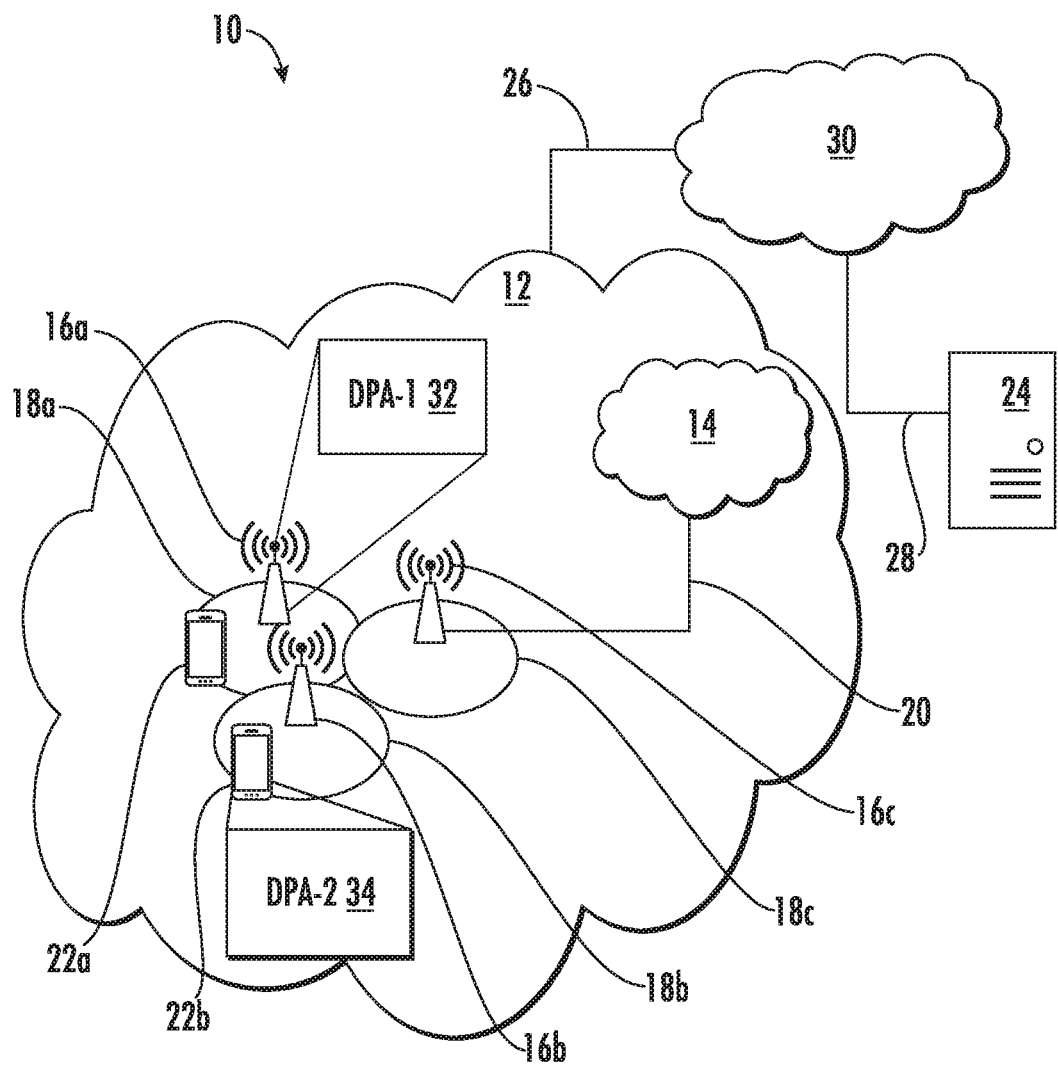
FIG. 1 is a schematic diagram of an exemplary network architecture illustrating a communication system connecting a network nodes with wireless devices according to principles disclosed herein.

Before describing in detail exemplary embodiments, it is noted that the embodiments reside primarily in combinations of apparatus components and processing steps related to baseband frequency selective and symbol based power adaptive magnitude and phase adjustment for wideband Doherty power amplifiers. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

The term "network node" used herein can be any kind of network node comprised in a radio network which may further comprise any of base station (BS), radio base station, base transceiver station (BTS), base station controller (BSC), radio network controller (RNC), g Node B (gNB), evolved Node B (eNB or eNodeB), Node B, multi-standard radio (MSR) radio node such as MSR BS, multi-cell/multicast coordination entity (MCE), integrated access and backhaul (IAB) node, relay node, donor node controlling relay, radio access point (AP), transmission points, transmission nodes, Remote Radio Unit (RRU) Remote Radio Head (RRH), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment. The term "radio node" used herein may be used to also denote a wireless device (WD) such as a wireless device (WD) or a radio network node.

In some embodiments, the non-limiting terms wireless device (WD) or a user equipment (UE) are used interchangeably. The WD herein can be any type of wireless device capable of communicating with a network node or another WD over radio signals, such as wireless device (WD). The WD may also be a radio communication device, target device, device to device (D2D) WD, machine type WD or WD capable of machine to machine communication (M2M), low-cost and/or low-complexity WD, a sensor equipped with WD, Tablet, mobile terminals, smart phone, laptop embedded equipped (LEE), laptop mounted equipment (LME), USB dongles, Customer Premises Equipment (CPE), an Internet of Things (IoT) device, or a Narrowband IoT (NB-IOT) device, etc.

Also, in some embodiments the generic term "radio network node" is used. It can be any kind of a radio network node which may comprise any of base station, radio base station, base transceiver station, base station controller, network controller, RNC, evolved Node B (eNB), Node B, gNB, Multi-cell/multicast Coordination Entity (MCE), IAB node, relay node, access point, radio access point, Remote Radio Unit (RRU) Remote Radio Head (RRH).

Note that although terminology from one particular wireless system, such as, for example, 3GPP LTE and/or New Radio (NR), may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure.

Note further, that functions described herein as being performed by a wireless device or a network node may be distributed over a plurality of wireless devices and/or network nodes. In other words, it is contemplated that the functions of the network node and wireless device described herein are not limited to performance by a single physical device and, in fact, can be distributed among several physical devices.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In wideband carrier aggregation applications, a baseband signal contains multiple carriers over a bandwidth that can exceed a few hundred MHz. Over such a large bandwidth, the peak to average power ratio is likely to be different at each carrier frequency. Also, the mean and variance of the signal is likely to be different at each carrier frequency. Thus, in some embodiments, the magnitude and phase difference between signals in the main branch and the peak branch are adaptively adjusted based on statistics of the signal at each carrier frequency. The adaptive adjusting may be responsive to changing signal statistics on a symbol to symbol basis.

Referring now to the drawing figures, in which like elements are referred to by like reference numerals, there is shown in FIG. 1 a schematic diagram of a communication system 10, according to an embodiment, such as a 3GPP-type cellular network that may support standards such as LTE and/or NR (5G), which comprises an access network 12, such as a radio access network, and a core network 14. The access network 12 comprises a plurality of network nodes 16a, 16b, 16c (referred to collectively as network nodes 16), such as NBs, eNBs, gNBs or other types of wireless access points, each defining a corresponding coverage area 18a, 18b, 18c (referred to collectively as coverage areas 18). Each network node 16a, 16b, 16c is connectable to the core network 14 over a wired or wireless connection 20. A first wireless device (WD) 22a located in coverage area 18a is configured to wirelessly connect to, or be paged by, the corresponding network node 16a. A second WD 22b in coverage area 18b is wirelessly connectable to the corresponding network node 16b. While a plurality of WDs 22a, 22b (collectively referred to as wireless devices 22) are illustrated in this example, the disclosed embodiments are equally applicable to a situation where a sole WD is in the coverage area or where a sole WD is connecting to the corresponding network node 16. Note that although only two WDs 22 and three network nodes 16 are shown for convenience, the communication system may include many more WDs 22 and network nodes 16.

Also, it is contemplated that a WD 22 can be in simultaneous communication and/or configured to separately communicate with more than one network node 16 and more than one type of network node 16. For example, a WD 22 can have dual connectivity with a network node 16 that supports LTE and the same or a different network node 16 that supports NR. As an example, WD 22 can be in communication with an eNB for LTE/E-UTRAN and a gNB for NR/NG-RAN.

The communication system 10 may itself be connected to a host computer 24, which may be embodied in the hardware and/or software of a standalone server, a cloud-implemented server, a distributed server or as processing resources in a server farm. The host computer 24 may be under the ownership or control of a service provider, or may be operated by the service provider or on behalf of the service provider. The connections 26, 28 between the communication system 10 and the host computer 24 may extend directly from the core network 14 to the host computer 24 or may extend via an optional intermediate network 30. The intermediate network 30 may be one of, or a combination of more than one of, a public, private or hosted network. The intermediate network 30, if any, may be a backbone network or the Internet. In some embodiments, the intermediate network 30 may comprise two or more sub-networks (not shown).

The communication system of FIG. 1 as a whole enables connectivity between one of the connected WDs 22a, 22b and the host computer 24. The connectivity may be described as an over-the-top (OTT) connection. The connected WDs 22a, 22b are configured to communicate data and/or signaling via a connection, using the access network 12, the core network 14, any intermediate network 30 and possible further infrastructure (not shown) as intermediaries. The connection may be transparent in the sense that at least some of the participating communication devices through which the connection passes are unaware of routing of uplink and downlink communications. For example, a network node 16 may not or need not be informed about the past routing of an incoming downlink communication with data originating from a host computer 24 to be forwarded (e.g., handed over) to a connected WD 22a. Similarly, the network node 16 need not be aware of the future routing of an outgoing uplink communication originating from the WD 22a towards the host computer 24.

A network node 16 is configured to include a Doherty power amplifier DPA-1 32 which is configured to amplify signals across a broad frequency band and to adaptively allocate power among main and peak paths and adaptively adjust phase differences between the signals in the main and peak paths. Similarly, a wireless device 22 is configured to include a Doherty power amplifier 34 which is configured to amplify signals across a broad frequency band and to adaptively allocate power among main and peak paths and adaptively adjust phase differences between the signals in the main and peak paths.

Example implementations, in accordance with an embodiment, of the WD 22, network node 16 and host computer 24 discussed in the preceding paragraphs will now be described with reference to FIG. 2. The communication system 10 includes a network node 16 provided in a communication system 10 and including hardware 58 enabling it to communicate with the WD 22. The hardware 58 may include a communication interface 60 for setting up and maintaining a wired or wireless connection with an interface of a different communication device of the communication system 10, as well as a radio interface 62 for setting up and maintaining at least a wireless connection 64 with a WD 22 located in a coverage area 18 served by the network node 16. The radio interface 62 may be formed as or may include, for example, one or more RF transmitters, one or more RF receivers, and/or one or more RF transceivers. The communication interface 60 may be configured to facilitate a connection 66 to the host computer 24. The connection 66 may be direct or it may pass through a core network 14 of the communication system 10 and/or through one or more intermediate networks 30 outside the communication system 10. The radio interface 62 includes the DPA-1 32.

In the embodiment shown, the hardware 58 of the network node 16 further includes processing circuitry 68. The processing circuitry 68 may include a processor 70 and a memory 72. In particular, in addition to or instead of a processor, such as a central processing unit, and memory, the processing circuitry 68 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 70 may be configured to access (e.g., write to and/or read from) the memory 72, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory). The memory 72 is configured to include look up tables 73 which provide magnitude and phase adjustment information, as will be described below.

Thus, the network node 16 further has software 74 stored internally in, for example, memory 72, or stored in external memory (e.g., database, storage array, network storage device, etc.) accessible by the network node 16 via an external connection. The software 74 may be executable by the processing circuitry 68. The processing circuitry 68 may be configured to control any of the methods and/or processes described herein and/or to cause such methods, and/or processes to be performed, e.g., by network node 16. Processor 70 corresponds to one or more processors 70 for performing network node 16 functions described herein. The memory 72 is configured to store data, programmatic software code and/or other information described herein. In some embodiments, the software 74 may include instructions that, when executed by the processor 70 and/or processing circuitry 68, causes the processor 70 and/or processing circuitry 68 to perform the processes described herein with respect to network node 16.

The communication system 10 further includes the WD 22 already referred to. The WD 22 may have hardware 80 that may include a radio interface 82 configured to set up and maintain a wireless connection 64 with a network node 16 serving a coverage area 18 in which the WD 22 is currently located. The radio interface 82 may be formed as or may include, for example, one or more RF transmitters, one or more RF receivers, and/or one or more RF transceivers. The radio interface 82 includes DPA-2 34 which is configured to amplify signals across a broad frequency band and to adaptively allocate power among main and peak paths and adaptively adjust phase differences between the signals in the main and peak paths.

The hardware 80 of the WD 22 further includes processing circuitry 84. The processing circuitry 84 may include a processor 86 and memory 88. In particular, in addition to or instead of a processor, such as a central processing unit, and memory, the processing circuitry 84 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 86 may be configured to access (e.g., write to and/or read from) memory 88, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory). The memory 88 includes look up tables 89 which are configured to provide magnitude and phase adjustment information, as will be described below.

Thus, the WD 22 may further comprise software 90, which is stored in, for example, memory 88 at the WD 22, or stored in external memory (e.g., database, storage array, network storage device, etc.) accessible by the WD 22. The software 90 may be executable by the processing circuitry 84. The software 90 may include a client application 92. The client application 92 may be operable to provide a service to a human or non-human user via the WD 22, with the support of the host computer 24. In the host computer 24, an executing host application 50 may communicate with the executing client application 92 via the OTT connection 52 terminating at the WD 22 and the host computer 24. In providing the service to the user, the client application 92 may receive request data from the host application 50 and provide user data in response to the request data. The OTT connection 52 may transfer both the request data and the user data. The client application 92 may interact with the user to generate the user data that it provides.

The processing circuitry 84 may be configured to control any of the methods and/or processes described herein and/or to cause such methods, and/or processes to be performed, e.g., by WD 22. The processor 86 corresponds to one or more processors 86 for performing WD 22 functions described herein. The WD 22 includes memory 88 that is configured to store data, programmatic software code and/or other information described herein. In some embodiments, the software 90 and/or the client application 92 may include instructions that, when executed by the processor 86 and/or processing circuitry 84, causes the processor 86 and/or processing circuitry 84 to perform the processes described herein with respect to WD 22.

Figure 2:
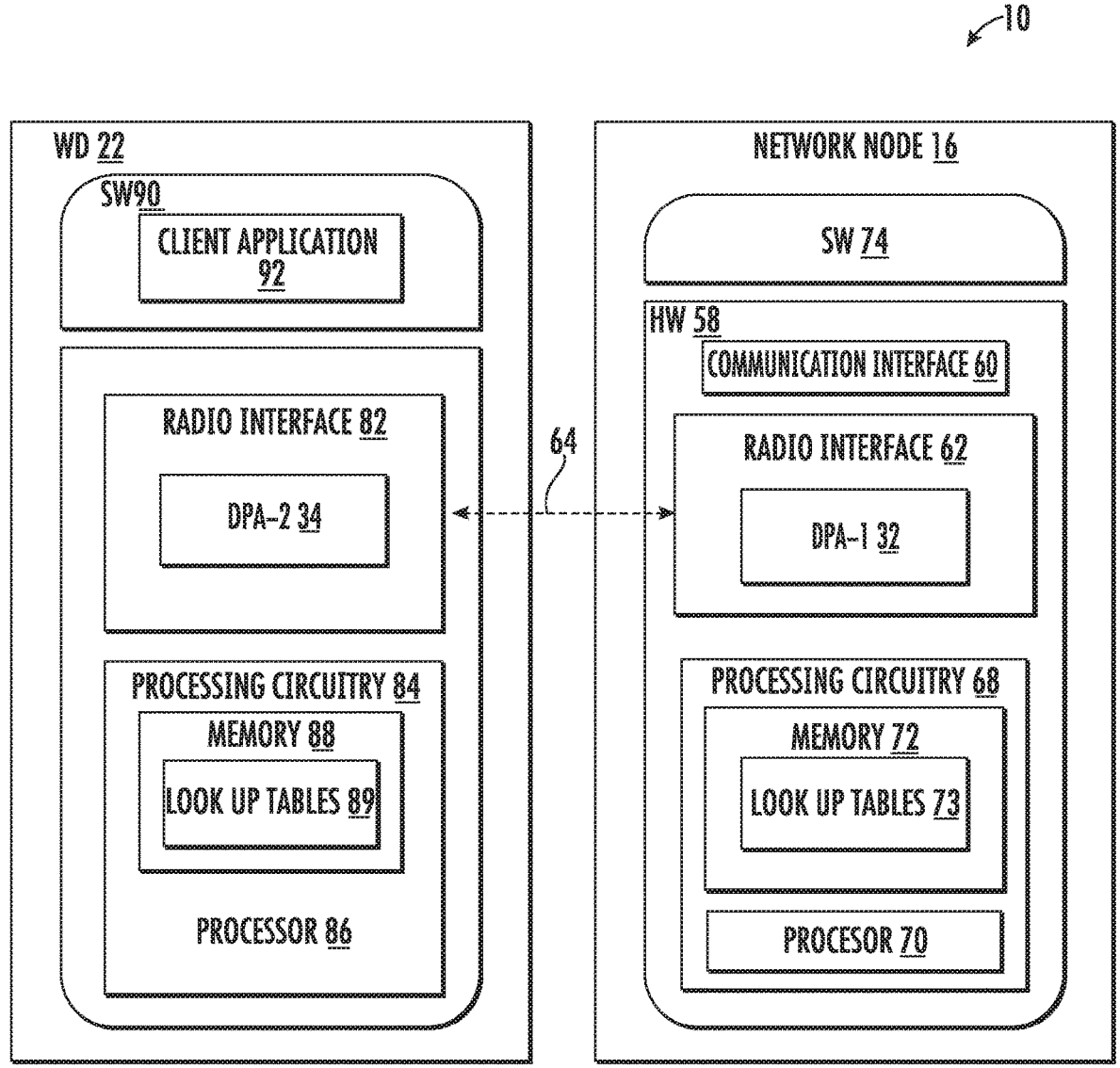
FIG. 2 is a block diagram of a network node in communication with a wireless device over an at least partially wireless connection according to some embodiments of the present disclosure.

In some embodiments, the inner workings of the network node 16 and WD 22 may be as shown in FIG. 2 and independently, the surrounding network topology may be that of FIG. 1.

The wireless connection 64 between the WD 22 and the network node 16 is in accordance with the teachings of the embodiments described throughout this disclosure. More precisely, the teachings of some of these embodiments may improve the data rate, latency, and/or power consumption and thereby provide benefits such as reduced user waiting time, relaxed restriction on file size, better responsiveness, extended battery lifetime, etc.

Figure 3:
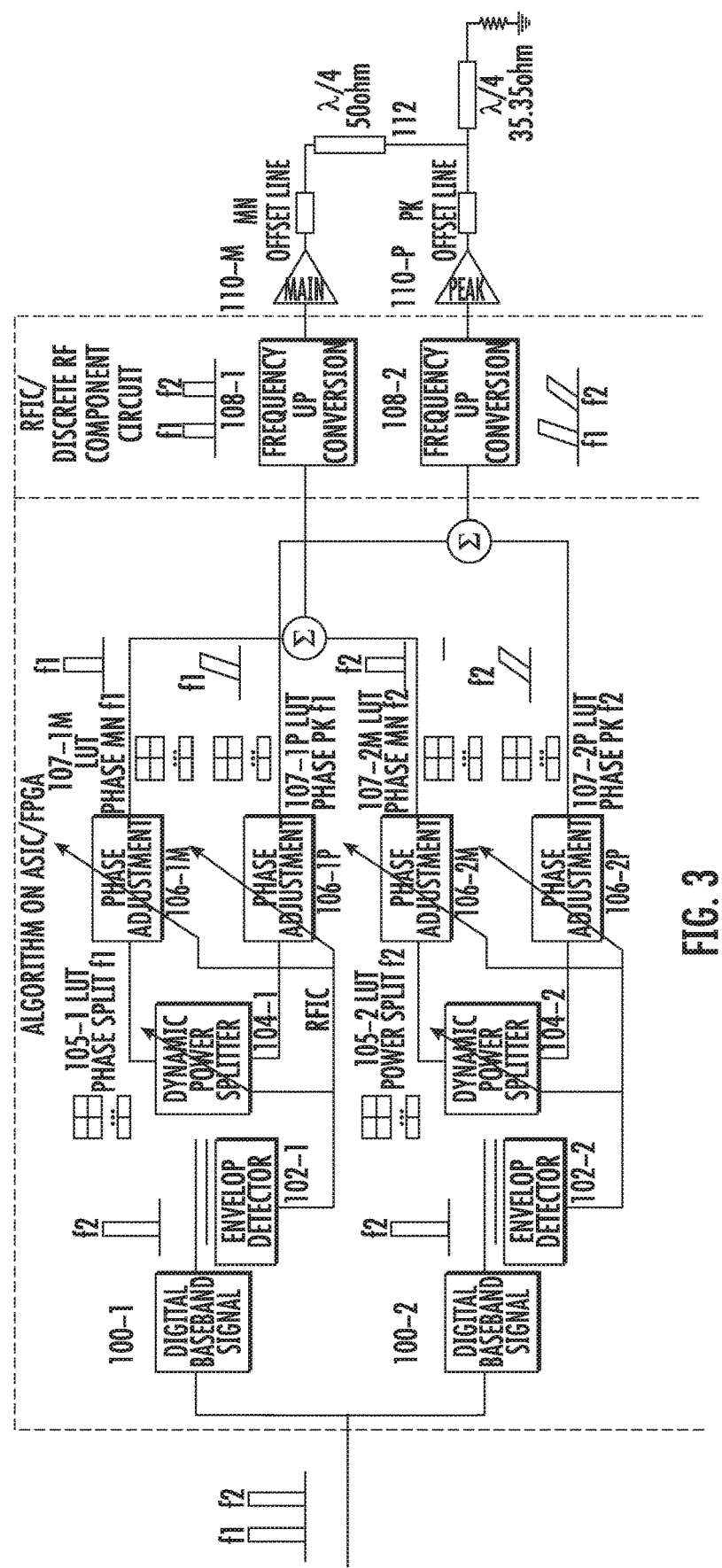
FIG. 3 is a first block diagram of a Doherty power amplifier (DPA) constructed according to principles set forth herein.

FIG. 3 is a block diagram of an example embodiment of a Doherty power amplifier (DPA) 32 or 34, showing two input channels, each channel being dedicated to processing an input signal at one of two different frequencies, f1 and f2. Note that in some embodiments, there can be a channel for each of more than two frequencies, and operation for each channel will be similar to the operation of the channels of FIG. 1. Note also that DPA-1 and DPA-2 may be dissimilar with respect to values and numbers of frequencies for which independent paths are provided, the size of the look up tables 73 and 89, and whether portions of the DPA are implemented by an integrated circuit that is separate from or included with an RF integrated circuit (RFIC) that implements frequency up conversion. Note that although only two input channels are shown, a DPA may have more than two channels corresponding to more than two frequencies, and the principles set forth herein as to two channels can be readily extended to more than two channels.

Figure 4:
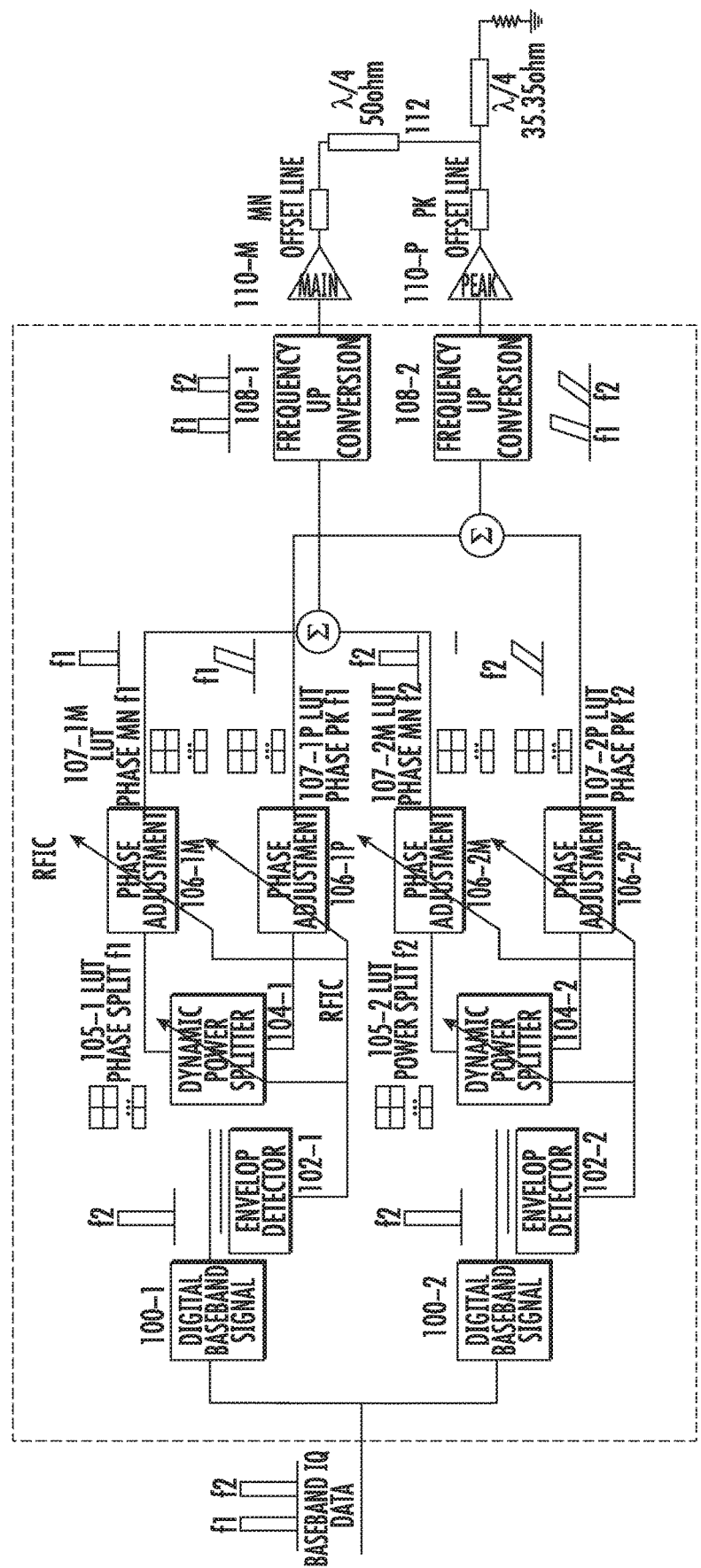
FIG. 4 is a second block diagram of a Doherty power amplifier (DPA) constructed according to principles set forth herein.

FIG. 3 shows an example of a DPA 32, 34 implemented in part on an application specific integrated circuit and/or a field programmable gate array and in part on a separate RFIC. FIG. 4 shows an example of a DPA 32, 34 implemented in part on an RFIC. The operation of the DPAs 32, 34 shown in FIGS. 3 and 4 may be the same. Accordingly, like elements in FIGS. 3 and 4 are like numbered and an explanation of the operation of the DPA of FIG. 3 will suffice to explain the operation of the DPA of FIG. 4.

Referring to FIG. 3, a signal having two carrier frequencies f1 and f2, are input to a first digital baseband signal filter 100-1 which isolates the signal associated with carrier frequency f1 and a second digital baseband signal filter 100-2 which isolates the signal associated with carrier frequency f2. In the first channel for processing the signal of carrier frequency f1, a first envelope detector 102-1 detects the envelope of the signal of carrier frequency f1. In the second channel for processing the signal of carrier frequency f2, a second envelope detector 102-2 detects the envelop of the signal of carrier frequency f2. In the first channel, the envelope detected by the envelope detector 102-1 controls a first dynamic power splitter 104-1 which splits the power of the signal of carrier frequency f1 into a first channel main path and a first channel peak path. Similarly, in the second channel, the envelope detected by the second envelope detector 102-2 controls a second dynamic power splitter 104-2 which splits the power of the signal of carrier frequency f2 into a second channel main path and a second channel peak path.

Associated with the first dynamic power splitter 104-1 is a first channel first look up table 105-1 which may be implemented by the processing circuitry 68, 84. The first channel first look up table 105-1 maps the envelope detected by the first envelope detector 102-1 to a first dynamic power splitter setting that determines the allocation of power between the first channel main path and the first channel peak path split by the first dynamic power splitter 104-1. Similarly, the second channel first look up table 105-2 maps the envelope detected by the second envelope detector 102-2 to a second dynamic power splitter setting that determines the allocation of power between the second channel main path and the second channel peak path split by the second dynamic power splitter 104-2.

The first channel main path has a first channel main path phase adjuster 106-1M and the first channel peak path has a first channel peak path phase adjuster 106-1P. The first channel main path phase adjuster 106-1M is adjusted according to a value from a first channel main path look up table 107-1M which maps the envelope detected by the first envelope detector 102-1 to a phase value for the first channel main path. Similarly, the first channel main peak path phase adjuster 106-1P is adjusted according to a value from a first channel main peak path look up table 107-1P which maps the envelope detected by the first envelope detector 102-1 to a phase value for the first channel peak path.

The second channel main path has a second channel main path phase adjuster 106-2M and the second channel peak path has a second channel peak path phase adjuster 106-2P. The second channel main path phase adjuster 106-2M is adjusted according to a value from a second channel main path look up table 107-2M which maps the envelope detected by the second envelope detector 102-2 to a phase value for the second channel main path. Similarly, the second channel peak path phase adjuster 106-2P is adjusted according to a value from a second channel peak path look up table 107-2P which maps the envelope detected by the second envelope detector 102-2 to a phase value for the second channel peak path.

The output of the first channel main path is added to the output of the second channel main path and input to a first frequency up converter 108-1 and the output of the first channel peak path is added to the output of the second channel peak path and input to a second frequency up converter 108-2. The output of the first frequency up converter 108-1 is input to the main amplifier 110-M of the Doherty power amplifier 32, 34. The output of the second frequency up converter 108-2 is input to the peak amplifier 110-P of the Doherty power amplifier 32, 34. At the output of the main and peak amplifiers 110-M, 110-P, is an impedance network 112.

Thus, either the implementation of FIG. 3 or FIG. 4 has three look up tables for each carrier frequency. The first channel look up table 105-1 and the second channel look up table 105-2 may include predetermined power allocation ratios that are selected by the signal envelope power of the respective channel input signal. The first channel main path look up table and the second channel main path look up table may include respective predetermined phase adjustments that are selected by the signal envelope power of the respective channel input signal. Similarly, the first channel peak path look up table and the second channel peak path look up table may include respective predetermined phase adjustments that are selected by the signal envelope power of the respective channel input signal. Thus, the contents of all six look up tables shown in FIG. 3 or FIG. 4 are generally different because the signal statistics are generally different for each frequency f1 and f2 and because the phase of the main and peak amplifiers will generally be different for improved performance. Further, the contents of some or all of the six look up tables may be updated periodically, in some embodiments.

Figure 5:
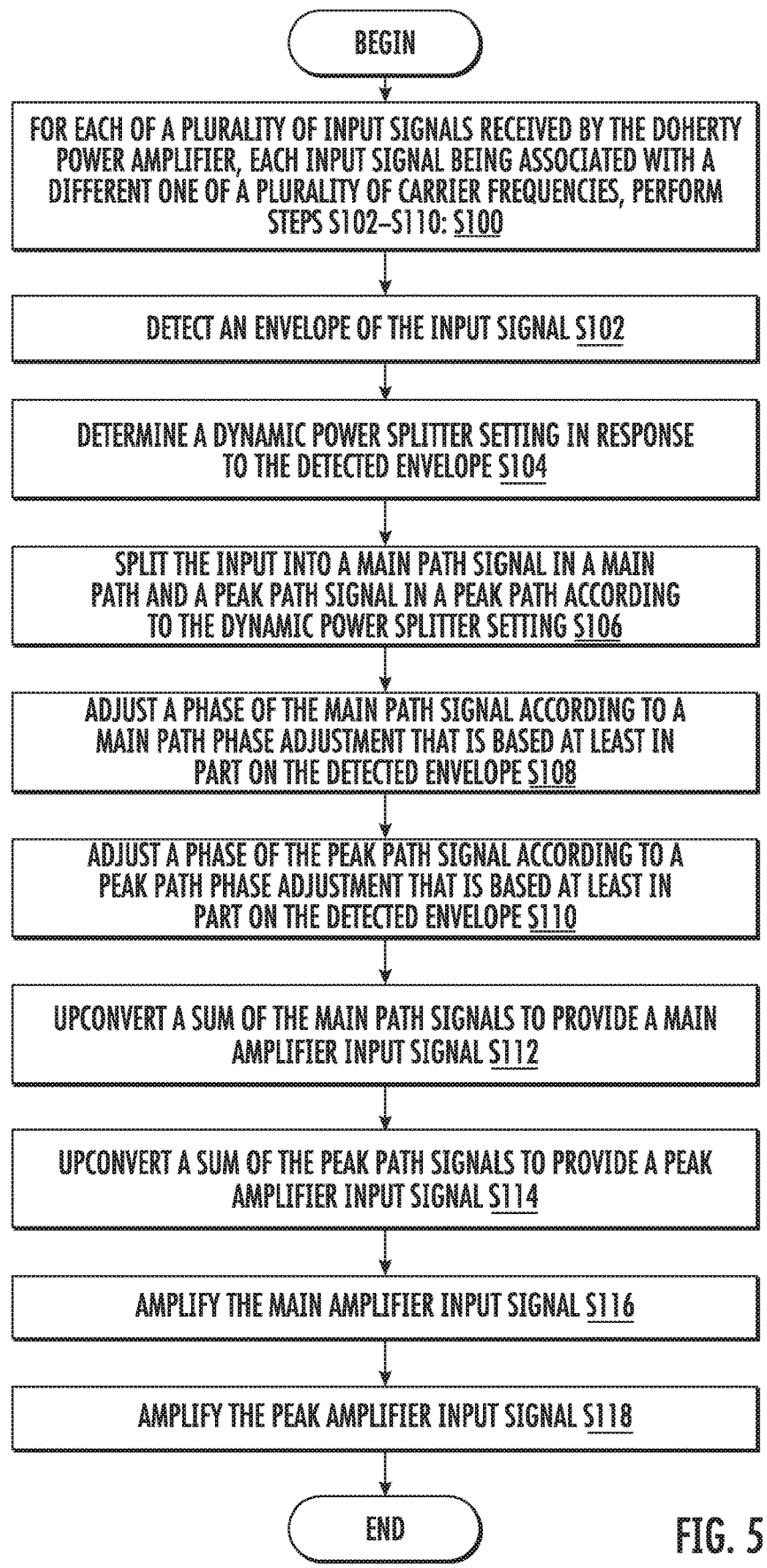
FIG. 5 is a flowchart of an example process for baseband frequency selective and symbol based power adaptive magnitude and phase adjustment for wideband Doherty power amplifiers

FIG. 5 is a flowchart of an example process for baseband frequency selective and symbol based power adaptive magnitude and phase adjustment for wideband Doherty power amplifiers. The process may be implemented by the DPA-1 32 or DPA-2 34 in conjunction with respective processing circuitry 68, 84, including respective look up tables 73, 89. The process includes for each of a plurality of input signals received by the Doherty power amplifier, each input signal being associated with a different one of a plurality of carrier frequencies (Block S100): detecting an envelope of the input signal (Block S102); determining a dynamic power splitter setting in response to the detected envelope (Block S104); splitting the input signal into a main path signal in a main path and a peak path signal in a peak path according to the dynamic power splitter setting (Block S106); adjusting a phase of the main path signal according to a main path phase adjustment that is based at least in part on the detected envelope (Block S108); and adjusting a phase of the peak path signal according to a peak path phase adjustment that is based at least in part on the detected envelope (Block S110). The process also includes upconverting a sum of the main path signals to provide a main amplifier input signal (Block S112); upconverting a sum of the peak path signals to provide a peak amplifier input signal (Block S114); amplifying the main amplifier input signal (Block S116); and amplifying the peak amplifier input signal (Block S118).

According to one aspect, a Doherty power amplifier 32, 34 is provided. The Doherty power amplifier 32, 34 includes an input configured to receive a plurality of input signals, each input signal being associated with a different one of a plurality of carrier frequencies. The DPA includes, for each of a plurality of the input signals received by the Doherty power amplifier 32, 34: an envelope detector 102-1, 102-2 configured to detect an envelope of the input signal; a first look up table 105-1, 105-2 configured to determine a dynamic power splitter setting in response to the detected envelope; a dynamic power splitter 104-1, 104-2 configured to split the input signal into a main path signal in a main path and a peak path signal in a peak path according to the dynamic power splitter setting; a main path phase adjuster 107-1M, 107-2M configured to adjust a phase of the main path signal according to a main path phase adjustment that is based at least in part on the detected envelope; and a peak path phase adjuster 1-0-1P, 107-2P configured to adjust a phase of the peak path signal according to a peak path phase adjustment that is based at least in part on the detected envelope. The DPA also includes a first upconverter 108-1 to upconvert a sum of the main path signals to provide a main amplifier input signal; a second upconverter 108-2 to upconvert a sum of the peak path signals to provide a peak amplifier input signal; a main amplifier 110-M configured to receive and amplify the main amplifier input signal; and a peak amplifier 110-P configured to receive and amplify the peak amplifier input signal.

According to this aspect, in some embodiments, at least one of the main path phase adjuster 107-1M, 107-2M and the peak path phase adjuster 106-1P, 106-2P for each input signal of the plurality of input signals is configured to produce a phase difference between the main path signal and the peak path signal, the phase difference being based at least in part on a power of the detected envelope of the input signal. In some embodiments, the dynamic power splitter setting, in response to the detected envelope of an input signal of the plurality of the input signals, establishes an allocation of power between the main path signal and the peak path signal based at least in part on a power of the detected envelope of the input signal. In some embodiments, the first look up table 105-1, 105-2 is configured to provide a mapping between a power of the detected envelope of the input signal and the dynamic power splitter setting, the mapping being based at least in part on statistics of the input signal. In some embodiments, the DPA includes a main path look up table 107-1M, 107-2M for each input signal of the plurality of input signals, the main path look up table 107-1M, 107-2M configured to provide a main path phase adjustment in response to the detected envelope of the input signal, the main path phase adjustment being utilized by the main path phase adjuster 106-1M, 106-2M to adjust the phase of the main path signal. In some embodiments, the main path phase adjustment is based at least in part on statistics of the input signal. In some embodiments, the DPA includes a peak path look up table 107-1P, 107-2P for each input signal of the plurality of input signals, the peak path look up table 107-1P, 107-2P providing a peak path phase adjustment in response to the detected envelope of the input signal, the peak path phase adjustment being utilized by the peak path phase adjuster 106-1P, 106-2P to adjust the phase of the peak path signal. In some embodiments, the peak path phase adjustment is based at least in part on statistics of the input signal. In some embodiments, at least one of the envelope detector 102-1, 102-2, first look up table 105-1, 105-2, dynamic power splitter 104-1, 104-2, main path phase adjuster 107-1M, 107-2M, and peak path phase adjuster 106-1P, 106-2P are comprised in application specific integrated circuitry in a signal path of the Doherty power amplifier 32, 34 that is prior to the first and second upconverters 108-1, 108-2, the first and second upconverters 109-1, 108-2 comprised in a radio frequency integrated circuit. In some embodiments, at least one of the envelope detector 102-1, 102-2, first look up table 105-1, 105-2, dynamic power splitter 104-1, 104-2, main path phase adjuster 106-1M, 106-2M and peak path phase adjuster 106-1P, 106-2P are comprised in a same radio frequency integrated circuit that comprises the first and second upconverters 108-1, 108-2.

According to another aspect, a method in a Doherty power amplifier 32, 34 is provided. The method may be implemented by processing circuitry 68, 84 and/or DPA-1 32, DPA-2 34, and includes (S100) for each of a plurality of input signals received by the Doherty power amplifier 32, 34, each input signal being associated with a different one of a plurality of carrier frequencies: detecting (S102) an envelope of the input signal; determining (S104) a dynamic power splitter setting in response to the detected envelope; splitting (S106) the input signal into a main path signal in a main path and a peak path signal in a peak path according to the dynamic power splitter setting; adjusting (S108) a phase of the main path signal according to a main path phase adjustment that is based at least in part on the detected envelope; and adjusting (S110) a phase of the peak path signal according to a peak path phase adjustment that is based at least in part on the detected envelope. The method further includes upconverting (S112) a sum of the main path signals to provide a main amplifier input signal; upconverting (S114) a sum of the peak path signals to provide a peak amplifier input signal; amplifying (S116) the main amplifier input signal; and amplifying (S118) the peak amplifier input signal.

According to this aspect, in some embodiments, at least one of adjusting the phase of the main path signal and adjusting the phase of the peak path signal is configured to produce a phase difference between the main path signal and the peak path signal, the phase difference being based at least in part on a power of the detected envelope of the input signal. In some embodiments, the determined dynamic power splitter setting, in response to the detected envelope of an input signal of the plurality of the input signals, establishes an allocation of power between the main path signal and the peak path signal based at least in part on a power of the detected envelope of the input signal. In some embodiments, the dynamic power splitter setting is selected from a first look up table configured to provide a mapping between a power of the detected envelope of the input signal and the dynamic power splitter setting, the mapping being based at least in part on statistics of the input signal. In some embodiments, the main path phase adjustment is obtained from a main path look up table in response to the detected envelope of the input signal. In some embodiments, the main path phase adjustment is based at least in part on statistics of the input signal. In some embodiments, the peak path phase adjustment is obtained from a peak path look up table in response to the detected envelope of the input signal. In some embodiments, the peak path phase adjustment is based at least in part on statistics of the input signal.

According to yet another aspect, a Doherty power amplifier 32, 34 is provided. The DPA includes an input having a first signal path and a second signal path. The first signal path is configured to receive a first input signal at a first frequency, the first signal path having first circuitry 102-1, 104-1, 105-1, 106-1M, 106-1P, 107-1M and 107-1P configured to split the first input signal into a first main path signal and a first peak path signal according to a first splitter ratio determined in response to a first envelope of the first input signal. The second signal path is configured to receive a second input signal at a second frequency, the second signal path having second circuitry 102-2, 104-2, 105-2, 106-2M, 106-2P, 107-2M and 107-2P configured to split the second input signal into a second main path signal and a second peak path signal according to a second splitter ratio determined in response to a second envelope of the second input signal.

According to this aspect, in some embodiments, the first splitter ratio is obtained from a first look up table responsive to the first envelope and the second splitter ratio is obtained from a second lookup table responsive to the second envelope. In some embodiments, the first splitter ratio and the second splitter ratio are based at least in part on statistics of the first input signal and the second input signal, respectively. In some embodiments, the first circuitry, including 106-1M, 106-1P, 107-1M, 107-1P, is further configured to adjust a phase of the first main path signal in response to the first envelope of the first input signal and to adjust a phase of the first peak path signal in response to the first envelope of the first input signal; and the second circuitry, including 106-2M, 106-2P, 107-2M, 107-2P is further configured to adjust a phase of the second main path signal in response to the second envelope of the second input signal and to adjust a phase of the second peak path signal in response to the second envelope of the second input signal.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A Doherty power amplifier, comprising:
   an input configured to receive a plurality of input signals, each input signal being associated with a different one of a plurality of carrier frequencies;
   for each of a plurality of the input signals received by the Doherty power amplifier:
      an envelope detector configured to detect an envelope of the input signal;
      a first look up table configured to determine a dynamic power splitter setting in response to the detected envelope;
      a dynamic power splitter configured to split the input signal into a main path signal in a main path and a peak path signal in a peak path according to the dynamic power splitter setting;
      a main path phase adjuster configured to adjust a phase of the main path signal according to a main path phase adjustment that is based at least in part on the detected envelope; and
      a peak path phase adjuster configured to adjust a phase of the peak path signal according to a peak path phase adjustment that is based at least in part on the detected envelope;
   a first upconverter to upconvert a sum of the main path signals to provide a main amplifier input signal;
   a second upconverter to upconvert a sum of the peak path signals to provide a peak amplifier input signal;
   a main amplifier configured to receive and amplify the main amplifier input signal; and
   a peak amplifier configured to receive and amplify the peak amplifier input signal.

2. The Doherty power amplifier of claim 1, wherein at least one of the main path phase adjuster and the peak path phase adjuster for each input signal of the plurality of input signals is configured to produce a phase difference between the main path signal and the peak path signal, the phase difference being based at least in part on a power of the detected envelope of the input signal.

3. The Doherty power amplifier of claim 1, wherein the dynamic power splitter setting, in response to the detected envelope of an input signal of the plurality of the input signals, establishes an allocation of power between the main path signal and the peak path signal based at least in part on a power of the detected envelope of the input signal.

4. The Doherty power amplifier of claim 3, wherein the first look up table is configured to provide a mapping between a power of the detected envelope of the input signal and the dynamic power splitter setting, the mapping being based at least in part on statistics of the input signal.

5. The Doherty power amplifier of claim 1, further comprising a main path look up table for each input signal of the plurality of input signals, the main path look up table configured to provide a main path phase adjustment in response to the detected envelope of the input signal, the main path phase adjustment being utilized by the main path phase adjuster to adjust the phase of the main path signal.

6. The Doherty power amplifier of claim 5, wherein the main path phase adjustment is based at least in part on statistics of the input signal.

7. The Doherty power amplifier of claim 1, further comprising a peak path look up table for each input signal of the plurality of input signals, the peak path look up table providing a peak path phase adjustment in response to the detected envelope of the input signal, the peak path phase adjustment being utilized by the peak path phase adjuster to adjust the phase of the peak path signal.

8. The Doherty power amplifier of claim 7, wherein the peak path phase adjustment is based at least in part on statistics of the input signal.

9. The Doherty power amplifier of claim 1, wherein at least one of the envelope detector, first look up table, dynamic power splitter, main path phase adjuster and peak path phase adjuster are comprised in application specific integrated circuitry in a signal path of the Doherty power amplifier that is prior to the first and second upconverters, the first and second upconverters comprised in a radio frequency integrated circuit.

10. The Doherty power amplifier of claim 1, wherein at least one of the envelope detector, first look up table, dynamic power splitter, main path phase adjuster and peak path phase adjuster are comprised in a same radio frequency integrated circuit that comprises the first and second upconverters.

11. A method in a Doherty power amplifier, the method being implemented by a radio interface, the method comprising:
for each of a plurality of input signals received by the Doherty power amplifier, each input signal being associated with a different one of a plurality of carrier frequencies:
detecting an envelope of the input signal;
determining a dynamic power splitter setting in response to the detected envelope;
splitting the input signal into a main path signal in a main path and a peak path signal in a peak path according to the dynamic power splitter setting;
adjusting a phase of the main path signal according to a main path phase adjustment that is based at least in part on the detected envelope; and
adjusting a phase of the peak path signal according to a peak path phase adjustment that is based at least in part on the detected envelope; and
upconverting a sum of the main path signals to provide a main amplifier input signal;
upconverting a sum of the peak path signals to provide a peak amplifier input signal;
amplifying the main amplifier input signal; and
amplifying the peak amplifier input signal.

12. The method of claim 11, wherein at least one of adjusting the phase of the main path signal and adjusting the phase of the peak path signal is configured to produce a phase difference between the main path signal and the peak path signal, the phase difference being based at least in part on a power of the detected envelope of the input signal.

13. The method of claim 11, wherein the determined dynamic power splitter setting, in response to the detected envelope of an input signal of the plurality of the input signals, establishes an allocation of power between the main path signal and the peak path signal based at least in part on a power of the detected envelope of the input signal.

14. The method of claim 13, wherein the dynamic power splitter setting is selected from a first look up table configured to provide a mapping between a power of the detected envelope of the input signal and the dynamic power splitter setting, the mapping being based at least in part on statistics of the input signal.

15. The method of claim 11, wherein the main path phase adjustment is obtained from a main path look up table in response to the detected envelope of the input signal.

16. The method of claim 15, wherein the main path phase adjustment is based at least in part on statistics of the input signal.

17. The method of claim 11, wherein the peak path phase adjustment is obtained from a peak path look up table in response to the detected envelope of the input signal.

18. The method of claim 17, wherein the peak path phase adjustment is based at least in part on statistics of the input signal.

19. A Doherty power amplifier, comprising:
an input having a first signal path and a second signal path;
the first signal path configured to receive a first input signal at a first frequency, the first signal path having first circuitry configured to split the first input signal into a first main path signal and a first peak path signal according to a first splitter ratio determined in response to a first envelope of the first input signal; and
the second signal path configured to receive a second input signal at a second frequency, the second signal path having second circuitry configured to split the second input signal into a second main path signal and a second peak path signal according to a second splitter ratio determined in response to a second envelope of the second input signal.

20. The Doherty power amplifier of claim 19, wherein the first splitter ratio is obtained from a first look up table responsive to the first envelope and the second splitter ratio is obtained from a second lookup table responsive to the second envelope.

21. The Doherty power amplifier of claim 19, wherein the first splitter ratio and the second splitter ratio are based at least in part on statistics of the first input signal and the second input signal, respectively.

22. The Doherty power amplifier of claim 19, wherein:
the first circuitry is further configured to adjust a phase of the first main path signal in response to the first envelope of the first input signal and to adjust a phase of the first peak path signal in response to the first envelope of the first input signal; and
the second circuitry is further configured to adjust a phase of the second main path signal in response to the second envelope of the second input signal and to adjust a phase of the second peak path signal in response to the second envelope of the second input signal.

* * * * *